US012417995B2

(12) United States Patent
Fan

(10) Patent No.: US 12,417,995 B2
(45) Date of Patent: Sep. 16, 2025

(54) CHIP PACKAGING STRUCTURE AND METHOD FOR PREPARING THE SAME, AND METHOD FOR PACKAGING SEMICONDUCTOR STRUCTURE

(71) Applicant: CHANGXIN MEMORY TECHNOLOGIES, INC., Hefei (CN)

(72) Inventor: Zengyan Fan, Hefei (CN)

(73) Assignee: CHANGXIN MEMORU TECHNOLOGIES, INC., Hefei (CN)

( * ) Notice: Subject to any disclaimer, the term of this patent is extended or adjusted under 35 U.S.C. 154(b) by 463 days.

(21) Appl. No.: 18/169,303

(22) Filed: Feb. 15, 2023

(65) Prior Publication Data

US 2023/0197666 A1    Jun. 22, 2023

Related U.S. Application Data

(63) Continuation of application No. PCT/CN2022/071277, filed on Jan. 11, 2022.

(30) Foreign Application Priority Data

Sep. 17, 2021  (CN) .......................... 202111091950.6

(51) Int. Cl.
*H01L 21/00* (2006.01)
*H01L 21/56* (2006.01)
(Continued)

(52) U.S. Cl.
CPC ............ *H01L 24/32* (2013.01); *H01L 21/563* (2013.01); *H01L 23/3135* (2013.01);
(Continued)

(58) Field of Classification Search
None
See application file for complete search history.

(56) References Cited

U.S. PATENT DOCUMENTS 9,728,479 B2    8/2017  Chou
10,002,815 B2   6/2018  Chou
(Continued)

FOREIGN PATENT DOCUMENTS

CN    106206510 A    12/2016
CN    110416170 A    11/2019
(Continued)

*Primary Examiner* — Nicholas J Tobergte
(74) *Attorney, Agent, or Firm* — SYNCODA LLC; Feng Ma

(57) ABSTRACT

A chip packaging structure and a method for preparing the same, and a method for packaging a semiconductor structure are provided, which relate to the technical field of semiconductors, and solve the technical problem of low yield of a chip. The chip packaging structure includes: a chip, an intermediate insulating layer arranged on the chip and a non-conductive adhesive layer arranged on the intermediate insulating layer, where a plurality of conductive pillar bumps are arranged on the chip, and each conductive pillar bump penetrates through the intermediate insulating layer; the intermediate insulating layer is provided with at least one group of holding holes, and the non-conductive adhesive layer fills the holding holes, so that grooves respectively matched with the holding holes are formed in a surface, far away from the intermediate insulating layer, of the non-conductive adhesive layer.

15 Claims, 12 Drawing Sheets

(51) Int. Cl.
*H01L 23/00* (2006.01)
*H01L 23/31* (2006.01)

(52) U.S. Cl.
CPC .............. *H01L 24/11* (2013.01); *H01L 24/16* (2013.01); *H01L 24/17* (2013.01); *H01L 24/29* (2013.01); *H01L 24/73* (2013.01); *H01L 24/81* (2013.01); *H01L 24/97* (2013.01); H01L 2224/11849 (2013.01); H01L 2224/16227 (2013.01); H01L 2224/16238 (2013.01); H01L 2224/17133 (2013.01); H01L 2224/17177 (2013.01); H01L 2224/17517 (2013.01); H01L 2224/26145 (2013.01); H01L 2224/26175 (2013.01); H01L 2224/29017 (2013.01); H01L 2224/29019 (2013.01); H01L 2224/32058 (2013.01); H01L 2224/32225 (2013.01); H01L 2224/73204 (2013.01); H01L 2224/81091 (2013.01); H01L 2224/81097 (2013.01); H01L 2224/81203 (2013.01); H01L 2224/97 (2013.01); H01L 2924/37001 (2013.01)

(56) References Cited

U.S. PATENT DOCUMENTS

| | | | |
|---|---|---|---|
| 10,515,827 B2 * | 12/2019 | Jeng | H01L 23/49822 |
| 2004/0087057 A1 * | 5/2004 | Wang | H01L 23/49816 |
| | | | 257/E21.503 |
| 2011/0260316 A1 * | 10/2011 | Jang | H01L 24/13 |
| | | | 257/737 |
| 2016/0005707 A1 | 1/2016 | Kwon et al. | |
| 2016/0315028 A1 | 10/2016 | Chou | |
| 2017/0040308 A1 * | 2/2017 | Ko | H01L 21/563 |
| 2017/0287801 A1 | 10/2017 | Chou | |

FOREIGN PATENT DOCUMENTS

| | | |
|---|---|---|
| JP | 2012074449 A | 4/2012 |
| JP | 2015056480 A | 3/2015 |
| TW | 461062 B | 10/2001 |

* cited by examiner

CHIP PACKAGING STRUCTURE AND METHOD FOR PREPARING THE SAME, AND METHOD FOR PACKAGING SEMICONDUCTOR STRUCTURE

CROSS-REFERENCE TO RELATED APPLICATION

The present application is a continuation of International Patent Application No. PCT/CN2022/071277, filed on Jan. 11, 2022, which claims priority to Chinese patent application No. 202111091950.6, filed on Sep. 17, 2021 and entitled "CHIP PACKAGING STRUCTURE AND METHOD FOR PREPARING THE SAME, AND METHOD FOR PACKAGING SEMICONDUCTOR STRUCTURE". The contents of International Patent Application No. PCT/CN2022/071277 and Chinese patent application No. 202111091950.6 are hereby incorporated by reference in their entireties.

BACKGROUND

With the increase of the number of Input/Output (I/O) pins in a chip packaging structure, the bump pitch among functional bumps of a chip becomes smaller and smaller in a case where the size of the chip decreases or the size of the chip is reduced, resulting in the inability to fill the interior of the chip to protect an electrode pad using a conventional capillary bottom filling process.

In order to solve the above problems, a thermocompression bonding process is generally used, in which a substrate is pre-coated with a non-conductive adhesive, and then a semiconductor chip is flipped on the substrate and thermocompression-bonded and welded, so as to solve the problems of difficulty in filling and pseudo soldering in the conventional capillary bottom filling process.

However, when the non-conductive adhesive is thermocompression-bonded, the non-conductive adhesive easily overflows the edge of the chip, resulting in low yield of the chip.

SUMMARY

The present disclosure relates to the technical field of packaging, in particular to a chip packaging structure and a method for preparing the same, and a method for packaging a semiconductor structure.

In a first aspect, a chip packaging structure is provided, which includes: a chip, an intermediate insulating layer arranged on the chip and a non-conductive adhesive layer arranged on the intermediate insulating layer. The chip is arranged with a plurality of conductive pillar bumps, and each of the plurality of conductive pillar bumps penetrates through the intermediate insulating layer. The intermediate insulating layer is provided with at least one group of holding holes, and the non-conductive adhesive layer fills the holding holes, so that grooves respectively matched with the holding holes are formed in a surface, far away from the intermediate insulating layer, of the non-conductive adhesive layer.

In a second aspect, a method for preparing a chip packaging structure is provided, which includes that: a chip is provided; an intermediate insulating layer is formed on the chip; at least one group of holding holes and a plurality of recesses exposing a circuit layer in the chip are formed on the intermediate insulating layer; a plurality of conductive pillar bumps are formed in the plurality of recesses, herein, the end, far away from the chip, of the conductive pillar bump, is provided with a welding portion, and the welding portion is a curved surface bent to the side far away from the conductive pillar bump; and a non-conductive adhesive layer is formed on the intermediate insulating layer, and the non-conductive adhesive layer fills the holding holes, so that grooves respectively matched with the holding holes are formed in the surface, far away from the intermediate insulating layer, of the non-conductive adhesive layer.

In a third aspect, a method for packaging a semiconductor structure is provided, which includes the following operations.

A substrate is provided, and a plurality of pads are arranged on the substrate; the chip packaging structure in the first aspect is provided, and the chip packaging structure is provided with a plurality of conductive pillar bumps corresponding to the plurality of pads; the chip packaging structure is flipped on the substrate, so that each conductive pillar bump on the chip packaging structure is in one-to-one correspondence with each pad on the substrate; a pressure facility is provided, and the pressure facility is located above the chip packaging structure; and the pressure facility provides a first preset temperature and a preset pressure for the chip packaging structure, so that each conductive pillar bump on the chip packaging structure is bonded and electrically conductive with the pad corresponding thereto on the substrate.

BRIEF DESCRIPTION OF THE DRAWINGS

In order to more clearly illustrate the embodiments of the present disclosure or the technical solutions in the related art, the drawings used in the description of the embodiments or the related art will be briefly described below. It is apparent that the drawings described below are only some embodiments of the present disclosure. Other drawings may further be obtained by those of ordinary skill in the art according to these drawings without creative efforts.

Reference signs are as follows.
- 100—chip packaging structure; 101—chip;
- 1011—metal wiring layer; 102—intermediate insulating layer;
- 103—non-conductive adhesive layer; 1031—groove;
- 104—conductive pillar; 1041—welding portion;
- 104a—conductive pillar bump; 104b—support bump;
- 105—holding hole; 1051—first holding hole;
- 1052—second holding hole; 106—exhaust passage;
- 107—mask layer; 1071—recess;
- 200—substrate; 201—pad;
- 300—pressure facility; 400—solder ball;
- 500—plastic sealing layer.

DETAILED DESCRIPTION

Figure 1:
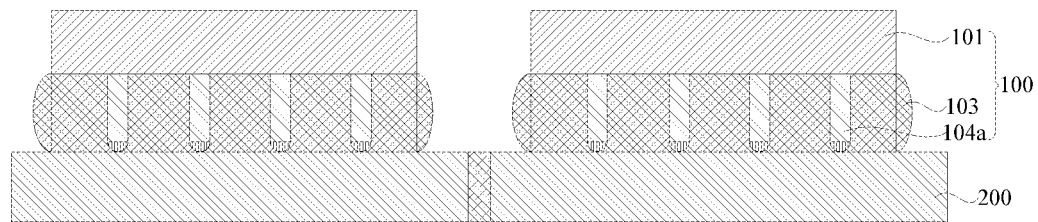
FIG. 1 is a schematic structural diagram of a chip packaging structure and a substrate after thermocompression bonding in the related art.

In the related art, as illustrated in FIG. 1, a conductive pillar bump 104a is arranged on a chip packaging structure 100, and a pad is arranged on a substrate 200. When the chip packaging structure 100 and the substrate 200 are thermocompression-bonded, the substrate 200 is usually coated with a layer of non-conductive adhesive with a certain thickness first, so that when the chip packaging structure 100 is flipped on the substrate 200 and thermocompression-bonded with the substrate 200, the non-conductive adhesive fills a capillary on the substrate 200, so as to solve the problems of the inability to fill the interior of a chip 101 and pseudo soldering in the capillary bottom filling process. However, when the chip packaging structure and the substrate are thermocompression-bonded, the non-conductive adhesive may overflow the side surface of the chip due to extrusion, resulting in low yield of the chip.

In order to solve the above problems, the embodiments of the present disclosure provide a chip packaging structure and a method for preparing the same, and a method for packaging a semiconductor structure, in the chip packaging structure, an intermediate insulating layer is arranged on the chip, at least one group of holding holes is arranged on the intermediate insulating layer, so that when the non-conductive adhesive layer is formed on the intermediate insulating layer, part of the non-conductive adhesive corresponding to each holding hole in the non-conductive adhesive layer may first fill the holding hole and thus a groove matched with the holding hole may be formed in the surface, far away from the intermediate insulating layer, of the non-conductive adhesive layer. During the packaging process of the chip packaging structure, part of the non-conductive adhesive in the non-conductive adhesive layer overflows the surface of the non-conductive adhesive layer under a first preset temperature and a preset pressure and flows to fill the grooves, so that part of the non-conductive adhesive overflowing the non-conductive adhesive layer may be prevented from overflowing the edge of the chip, thereby improving the yield of the chip.

In order to make the above purposes, features and advantages of the embodiments of the present disclosure clearer and understandable, the technical solutions in the embodiments of the present disclosure will be clearly and completely described below in combination with the drawings in the embodiments of the present disclosure. It is apparent that the described embodiments are only a part rather all of embodiments of the present disclosure. All other embodiments obtained by those of ordinary skill in the art based on the described embodiments of the present disclosure without creative efforts shall fall within the protection scope of the present disclosure.

Figure 2:
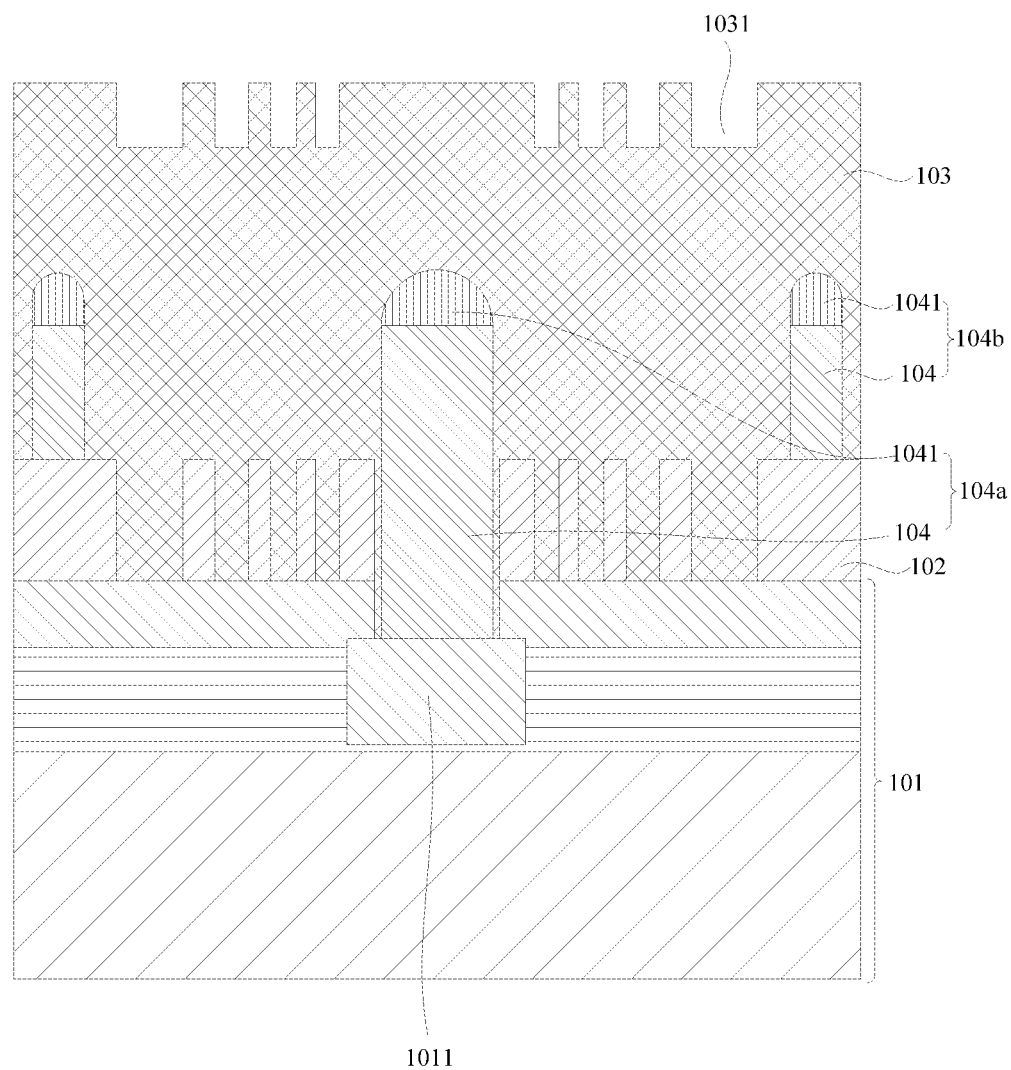
FIG. 2 is a schematic structural diagram of a chip packaging structure according to an embodiment of the present disclosure.
Figure 3:
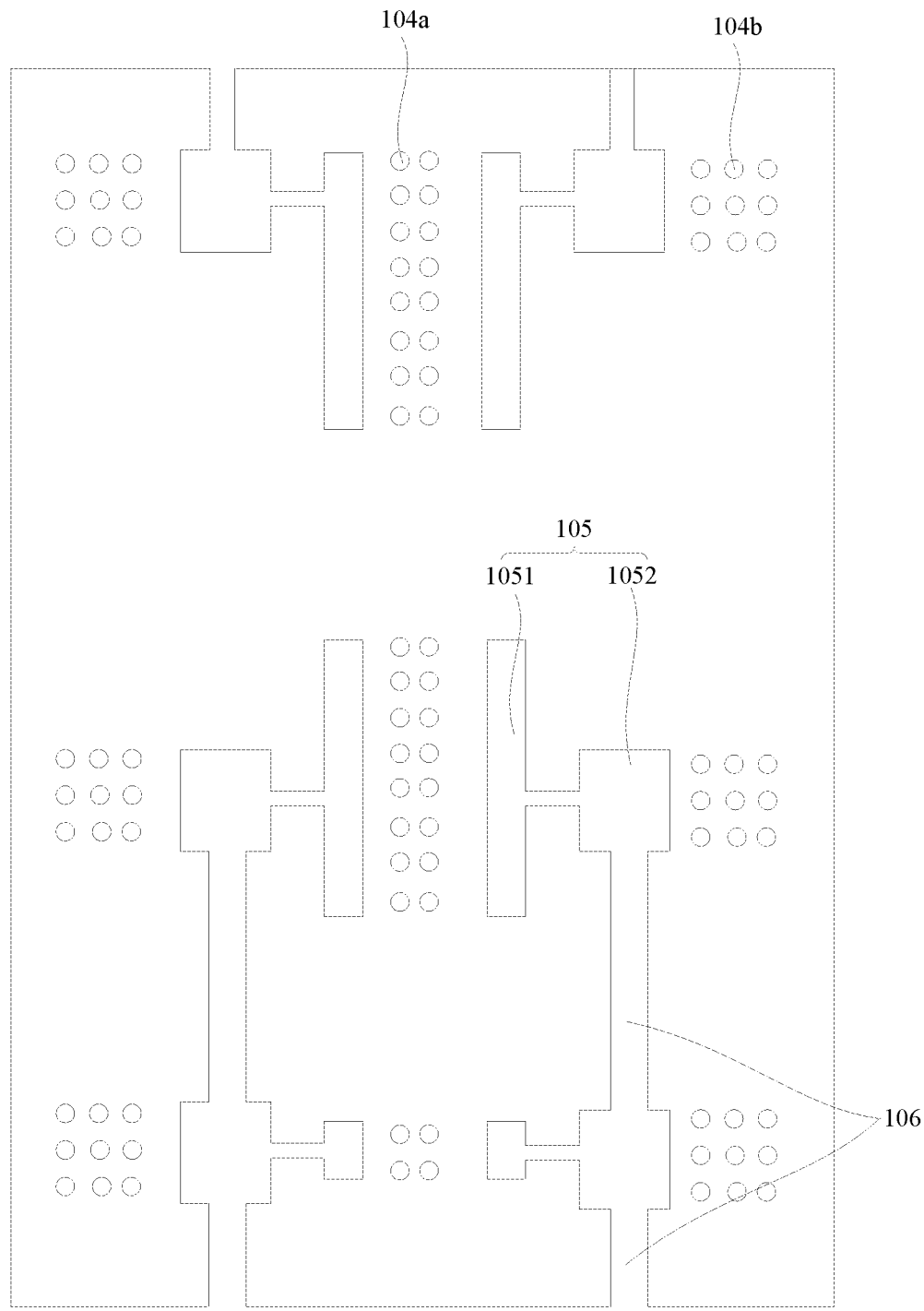
FIG. 3 is a top view diagram of a chip and an intermediate insulating layer according to an embodiment of the present disclosure.

FIG. 2 is a schematic structural diagram of a chip packaging structure according to an embodiment of the present disclosure. FIG. 3 is a top view diagram of a chip and an intermediate insulating layer according to an embodiment of the present disclosure.

As illustrated in FIG. 2 and FIG. 3, a chip packaging structure 100 provided by the embodiments of the present disclosure includes: a chip 101, an intermediate insulating layer 102 arranged on the chip 101 and a non-conductive adhesive layer 103 arranged on the intermediate insulating layer 102. A plurality of conductive pillar bumps 104a are arranged on the chip 101, and each conductive pillar bump 104a penetrates through the intermediate insulating layer 102. The intermediate insulating layer 102 is provided with at least one group of holding holes 105, and the non-conductive adhesive layer 103 fills the holding holes 105, so that grooves 1031 respectively matched with the holding holes 105 are formed in the surface, far away from the intermediate insulating layer 102, of the non-conductive adhesive layer 103.

It is understandable that when the non-conductive adhesive layer 103 is under the first preset temperature and the preset pressure, part of the non-conductive adhesive has fluidity, and may overflow the surface of the non-conductive adhesive layer 103. Since the surface of the non-conductive adhesive layer 103 is provided with the groove 1031, when part of the non-conductive adhesive overflows the surface of the non-conductive adhesive layer 103, the overflowing non-conductive adhesive may flow on the surface of the non-conductive adhesive layer 103 to fill the groove 1031, so that the non-conductive adhesive may be prevented from overflowing the edge of the chip, thereby improving the yield of the chip.

Herein, the first preset temperature refers to a temperature capable of converting the non-conductive adhesive from a solid state to a liquid state, so that the non-conductive adhesive has fluidity and adhesiveness. The preset pressure refers to a pressure required when the chip packaging structure 100 is packaged with a structure such as a substrate.

Exemplarily, the non-conductive adhesive layer 103 may be a thermosetting resin, a gum, a synthetic resin, etc. The intermediate insulating layer 102 may be a photoresist layer, etc. No specific limits are made thereto in the embodiments of the present disclosure.

In a specific implementation, when the chip packaging structure 100 is packaged with the structure such as the substrate, the non-conductive adhesive is under the first preset temperature and the preset pressure, part of the non-conductive adhesive may overflow the surface of the non-conductive adhesive layer 103, and the overflowing non-conductive adhesive may flow into the groove 1031 in the surface of the non-conductive adhesive layer 103, so that the non-conductive adhesive overflowing the non-conductive adhesive layer 103 may be prevented from overflowing the edge of the chip 101, thereby improving the yield of the chip 101.

It is understandable that the groove 1031 formed in the non-conductive adhesive layer 103 is configured to hold part of the non-conductive adhesive overflowing the surface of the non-conductive adhesive layer 103 to prevent the overflowing non-conductive adhesive from overflowing the edge of the chip 101.

Therefore, in the embodiments of the present disclosure, the intermediate insulating layer 102 is arranged on the chip 101, and the intermediate insulating layer 102 is provided with at least one group of holding holes 105, so that when the non-conductive adhesive layer 103 is formed on the intermediate insulating layer 102, part of the non-conductive adhesive corresponding to each holding hole 105 in the non-conductive adhesive layer 103 may first fill the holding hole 105 and thus the groove 1031 matched with the holding hole 105 may be formed in the surface, away from the intermediate insulating layer 102, of the non-conductive adhesive layer 103. During the packaging process of the chip packaging structure 100, part of the non-conductive adhesive in the non-conductive adhesive layer 103 overflows the surface of the non-conductive adhesive layer 103 under the first preset temperature and the preset pressure and flows to fill the grooves 1031, so that the part of the non-conductive adhesive overflowing the non-conductive adhesive layer 103 may be prevented from overflowing the edge of the chip, thereby improving the yield of the chip.

With continued reference to FIG. 2 and FIG. 3, the plurality of conductive pillar bumps 104a form at least one conductive pillar bump group, and each conductive pillar bump 104a is arranged on the chip 101 and is electrically connected to a metal wiring layer 1011 in the chip 101, and one end, far away from the chip 101, of each conductive pillar bump 104a penetrates through the intermediate insulating layer 102, so that the conductive pillar bump 104a is subsequently welded to the pad on the substrate to achieve electrical conduction. In addition, the chip packaging structure further includes a plurality of support bumps 104b, the plurality of support bumps 104b form at least one support bump group, and the support bumps 104b are respectively arranged on the intermediate insulating layer 102 at intervals. It is understandable that the support bumps 104b are mainly configured to support the chip 101 when the chip packaging structure 100 is flipped on the substrate.

It is understandable that the material of the conductive pillar bump 104a includes one or a combination of tin, copper, aluminum, nickel, gold, silver and titanium.

The plurality of groups of holding holes 105 are arranged close to the edges of the conductive pillar bumps 104a and the support bumps 104b, and the plurality of grooves 1031 respectively matched with the holding holes 105 are formed in the non-conductive adhesive layer 103. When the chip packaging structure 100 is subjected to a preset extrusion force, the non-conductive adhesive between each conductive pillar bump 104a and the support bump 104b and the pads 201 on the structure such as the substrate may be extruded to overflow, and the overflowing conductive adhesive may first fill the grooves 1031 at the edges of the conductive pillar bumps 104a and the support bumps 104b, so as to prevent the conductive adhesive from overflowing the edge of the chip 101, thereby improving the yield of the chip 101.

Herein, a pattern formed by arranging the conductive pillar bumps 104a in the conductive pillar bump group is different from a pattern formed by arranging the support bumps 104b in the support bump group. For example, the conductive pillar bump group forms a rectangle having a length direction extending in a first direction, and the support bump group forms a rectangle having a length direction extending in a second direction. Herein, the first and second directions may be perpendicular to each other in a horizontal plane.

Each group of holding holes 105 includes a first holding hole 1051 and a second holding hole 1052 which communicate with each other, the first holding hole 1051 being arranged at one side of the conductive pillar bump group, and the second holding hole 1052 being arranged at one side of the support bump group. In this way, the grooves 1031 matched with the first holding hole 1051 and the second holding hole 1052 respectively are formed in the positions respectively corresponding to the first holding hole 1051 and the second holding hole 1052 on the non-conductive adhesive layer 103, when the chip packaging structure 100 is packaged with the substrate, the groove 1031 near the conductive pillar bump group may hold the non-conductive adhesive overflowing by extrusion near the conductive pillar bump group, and the groove 1031 near the support bump group may hold the non-conductive adhesive overflowing by extrusion near the support bump group, so as to prevent the non-conductive adhesive from overflowing the edge of the chip 101, thereby improving the yield of the chip 101.

Preferably, with continued reference to FIG. 3, the pattern of the first holding hole 1051 may be matched with the arrangement pattern of the conductive pillar bumps 104a in the conductive pillar bump group, so that the groove 1031 formed in the non-conductive adhesive layer 103 is also matched with the arrangement pattern of the conductive pillar bump group. The pattern of the second holding hole 1052 is matched with the arrangement pattern of the support bumps 104b in the support bump group, so that the groove 1031 formed in the non-conductive adhesive layer 103 is also matched with the arrangement pattern of the support bump group.

Exemplarily, when the conductive pillar bumps 104a in the conductive pillar bump group are arranged to form a rectangle, the pattern of the first holding hole 1051 is also a rectangle matched with the shape and the size of the rectangle formed by the conduction pillar bumps, and the groove 1031 matched with the first holding hole 1051 and formed in the non-conductive adhesive layer 103 is also a rectangle, so that the non-conductive adhesive overflowing near the conductive pillar bump group may be better held to prevent the non-conductive adhesive from overflowing the edge of the chip 101. Of course, when the support bumps 104b in the support bump group are arranged to form a rectangle, the pattern of the second holding hole 1052 is also a rectangle matched with the shape and the size of the rectangle formed by the support bumps, and the groove 1031 matched with the second holding hole 1052 and formed in the non-conductive adhesive layer 103 is also a rectangle, so that the non-conductive adhesive overflowing near the support bump group may be better held to prevent the non-conductive adhesive from overflowing the edge of the chip 101.

In the embodiments of the present disclosure, the distance from the first holding hole 1051 to the edge of each conductive pillar bump 104a corresponding to the first holding hole 1051 may be 9-11 μm, preferably, the distance from the first holding hole 1051 to the edge of each conductive pillar bump 104a corresponding to the first holding hole 1051 is 10 µm. In this way, the distance from the groove 1031 matched with the first holding hole 1051 and formed on the non-conductive adhesive layer 103 to the edge of the conductive pillar bump 104a is also 9-11 µm, so that when the non-conductive adhesive corresponding to the conductive pillar bump 104a is extruded to overflow, the overflowing non-conductive adhesive may fill the groove 1031, thereby preventing the non-conductive adhesive from overflowing the edge of the chip 101 and then improving the yield of the chip 101.

The distance from the second holding hole 1052 to the edge of each support bump 104b corresponding to the second holding hole 1052 may be 9-11 µm, preferably, the distance from the second holding hole 1052 to the edge of each support bump 104b corresponding to the second holding hole 1052 is 10 µm. In this way, the distance from the groove 1031 matched with the second holding hole 1052 and formed on the non-conductive adhesive layer 103 to the edge of the support bump 104b is also 9-11 µm so that when the non-conductive adhesive corresponding to the support bump 104b is extruded to overflow, the overflowing non-conductive adhesive may fill the groove 1031, thereby preventing the non-conductive adhesive from overflowing the edge of the chip 101 and then improving the yield of the chip 101.

At least two conductive pillar bump groups are provided, the at least two conductive pillar bump groups are arranged on the chip 101 at intervals, and each conductive pillar bump group corresponds to a respective one of first holding holes 1051. At least two support bump groups are provided, the at least two support bump groups are arranged on the chip 101 at intervals, and each support bump group corresponds to a respective one of second holding holes 1052. In this way, the grooves 1031 matched with the first holding hole 1051 and the second holding hole 1052 are respectively formed in the non-conductive adhesive layer 103, the non-conductive adhesive overflowing near the conductive pillar bump group fills the groove 1031 corresponding to the conductive pillar bump group, and the non-conductive adhesive overflowing near the support bump group fills the groove 1031 corresponding to the support bump group, so as to prevent the non-conductive adhesive from overflowing the edge of the chip 101, thereby improving the yield of the chip 101.

With continued reference to FIG. 3, the intermediate insulating layer 102 is provided with an exhaust passage 106 communicating with the holding holes 105. Herein, one exhaust passage 106 corresponds to one group of holding holes 105, and each exhaust passage 106 extends to the edge of the intermediate insulating layer 102 and communicates with the outside.

The intermediate insulating layer 102 is provided with the exhaust passage 106 communicating with the holding holes 105, so that air in the holding holes 105 and air bubbles in the non-conductive adhesive may be discharged from the exhaust passage 106 when the non-conductive adhesive layer 103 is formed or when the chip packaging structure 100 is packaged with the substrate.

The sum of the projected areas of the holding holes 105 on the intermediate insulating layer 102 is 3.5-4 times the sum of the projected areas of all the conductive pillar bumps 104a and all the support bumps 104b on the intermediate insulating layer 102 on the chip packaging structure 100.

It is understandable that the projected area of the groove 1031 corresponding to the holding hole 105 and formed in the non-conductive adhesive layer 103 on the intermediate insulating layer 102 is 3.5-4 times the projected area of all the conductive pillar bumps 104a and all the support bumps 104b on the chip 101 on the intermediate insulating layer 102, so that the holding performance of the non-conductive adhesive overflowing near the conductive pillar bump 104a by the groove 1031 is increased and the non-conductive adhesive is prevented from overflowing the edge of the chip 101, thereby improving the yield of the chip 101.

The thickness of the intermediate insulating layer 102 is 4.5-5 µm, so that the depth of the groove 1031 formed in the non-conductive adhesive layer 103 may be made moderate, the groove 1031 may be prevented from being too deep to make the surface of the non-conductive adhesive layer 103 uneven, and the groove 1031 may also be prevented from being too shallow to cause part of the non-conductive adhesive to overflow the edge of the chip 101.

It is understandable that each of the conductive pillar bump 104a and the support bump 104b includes a respective conductive pillar 104 and a respective welding portion 1041 arranged on the conductive pillar 104. Herein, the conductive pillar 104 located on the metal wiring layer 1011 and the welding portion 1041 form the conductive pillar bump 104a, the conductive pillar bump 104a is electrically connected to the metal wiring layer 1011. The conductive pillar 104 located on the intermediate insulating layer and the welding portion 1041 located on the conductive pillar 104 form the support bump 104b, which is mainly configured to support the device such as the chip.

It is understandable that the conductive pillar bump 104a and the support bump 104b may be formed by an integrated process to reduce the processing procedure and the processing cost.

Herein, the welding portion 1041 is a curved surface bent to the side away from the conductive pillar 104, and the welding portion 1041 is arranged to be the curved surface, so that the conductive pillar bump 104a abuts against and is electrically conductive with a pad on the structure such as the substrate.

It is understandable that the welding portion 1041 may be the arc-shaped surface or an elliptical curved surface. No specific limits are made thereto in the embodiments of the present disclosure.

In the chip packaging structure provided by the embodiments of the present disclosure, the intermediate insulating layer is arranged on the chip, and the intermediate insulating layer is provided with at least one group of holding holes, so that when the non-conductive adhesive layer is formed on the intermediate insulating layer, part of the non-conductive adhesive corresponding to each holding hole in the non-conductive adhesive layer may first fill the holding hole and thus the groove matched with the holding hole may be formed in the surface, far away from the intermediate insulating layer, of the non-conductive adhesive layer. During the packaging process of the chip packaging structure, part of the non-conductive adhesive in the non-conductive adhesive layer overflows the surface of the non-conductive adhesive layer under a first preset temperature and a preset pressure and flows to fill the grooves, so that part of the non-conductive adhesive overflowing the non-conductive adhesive layer may be prevented from overflowing the edge of the chip, thereby improving the yield of the chip.

Figure 4:
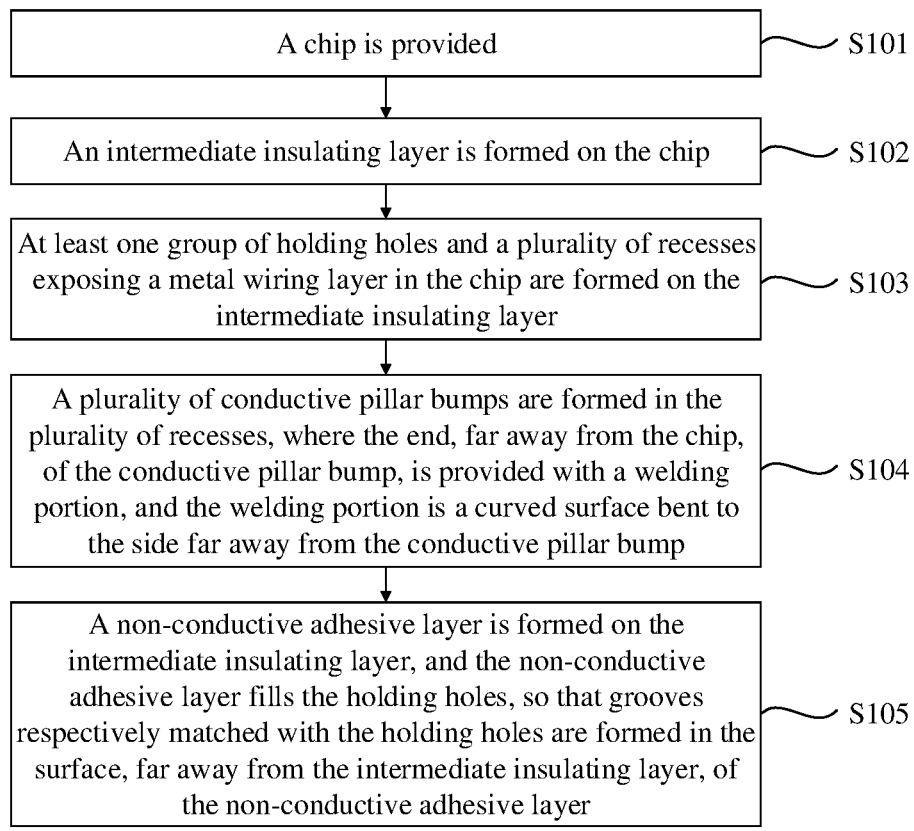
FIG. 4 is a flowchart of a method for preparing a chip packaging structure according to an embodiment of the present disclosure.

FIG. 4 is a flowchart of a method for preparing a chip packaging structure according to an embodiment of the present disclosure.

As illustrated in FIG. 4, the embodiments of the present disclosure also provide a method for preparing a chip packaging structure, which includes the following operations.

At S101, a chip is provided.

Figure 5:
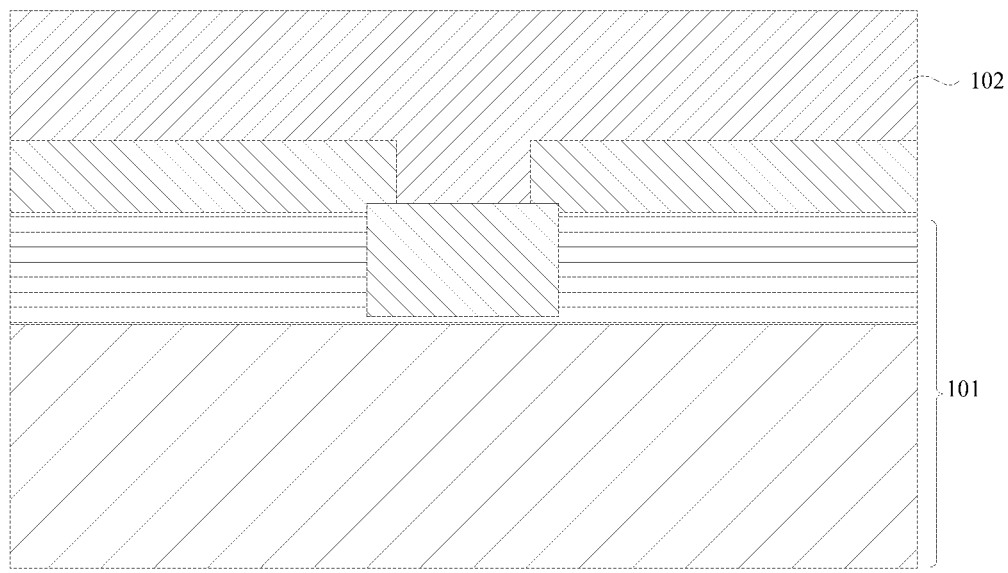
FIG. 5 is a schematic structural diagram of forming an intermediate insulating layer on a chip according to an embodiment of the present disclosure.

As illustrated in FIG. 5, the chip 101 includes a silicon substrate and a dielectric layer arranged on the silicon substrate. The dielectric layer is provided with an opening exposing the silicon substrate, and a conductive layer is formed in the opening. The dielectric layer includes a polyimide or high molecular material, so that the dielectric layer may serve the functions of insulation and buffering to prevent the chip 101 from being damaged.

At S102, an intermediate insulating layer is formed on the chip.

With continued reference to FIG. 5, the intermediate insulating layer 102 is formed on the dielectric layer and the opening. Herein, the intermediate insulating layer 102 may be a photoresist layer formed by coating on the dielectric layer and the opening.

At S103, at least one group of holding holes and a plurality of recesses exposing a metal wiring layer in the chip are formed on the intermediate insulating layer.

The operation specifically includes that: the intermediate insulating layer is patterned, and a first pattern group is formed on the intermediate insulating layer. In addition, a second pattern group may be also formed on the intermediate insulating layer at the same time.

Figure 6:
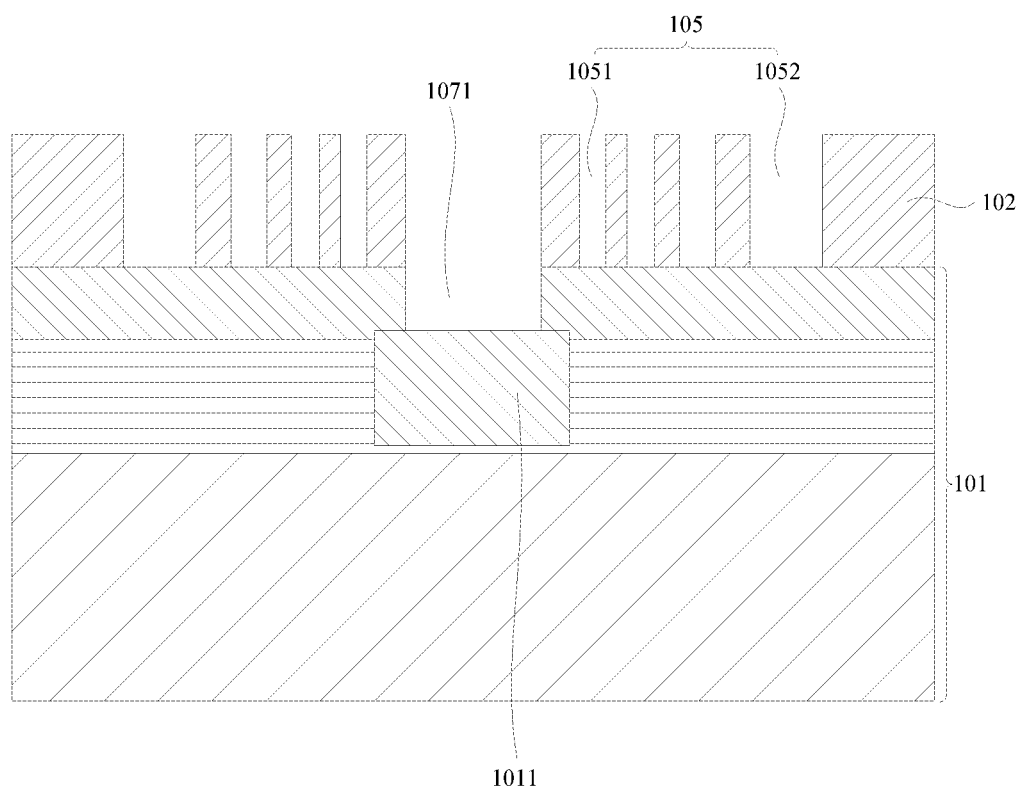
FIG. 6 is a schematic structural diagram of forming a holding hole in an intermediate insulating layer according to an embodiment of the present disclosure.

As illustrated in FIG. 6, the intermediate insulating layer 102 is removed according to the first pattern group to form at least one group of holding holes 105. The intermediate insulating layer 102 and part of the chip 101 are removed according to the second pattern group to expose the metal wiring layer in the chip 101 to form the plurality of recesses 1071.

The cross-sectional shape of the recess 1071 may be matched with the cross-sectional shape of the corresponding conductive pillar bump 104a.

At S104, a plurality of conductive pillar bumps are formed in the plurality of recesses. The end, far away from the chip, of the conductive pillar bump is provided with a welding portion, and the welding portion is a curved surface bent to the side far away from the conductive pillar bump.

The operation of forming the conductive pillar bump in each recess after the plurality of recesses are formed on the intermediate insulating layer and the support bump specifically includes the following operations.

Figure 7:
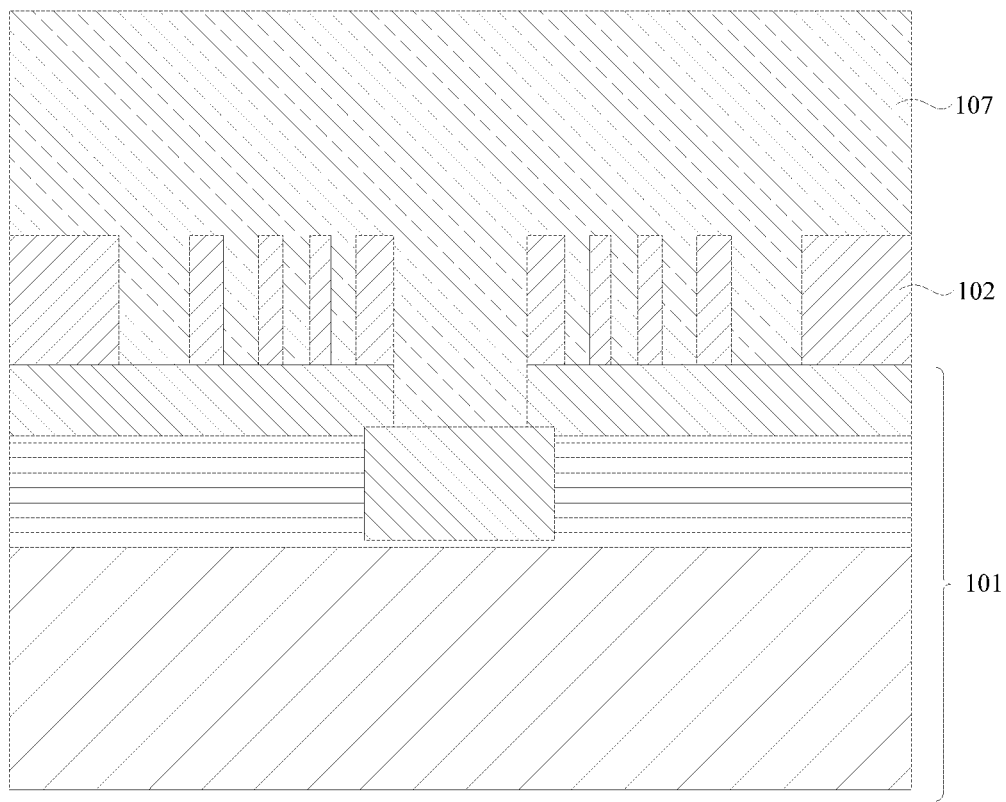
FIG. 7 is a schematic structural diagram of forming a mask layer on an intermediate insulating layer according to an embodiment of the present disclosure.

As illustrated in FIG. 7, a mask layer 107 is formed on the intermediate insulating layer 102, and the mask layer 107 is patterned.

Figure 8:
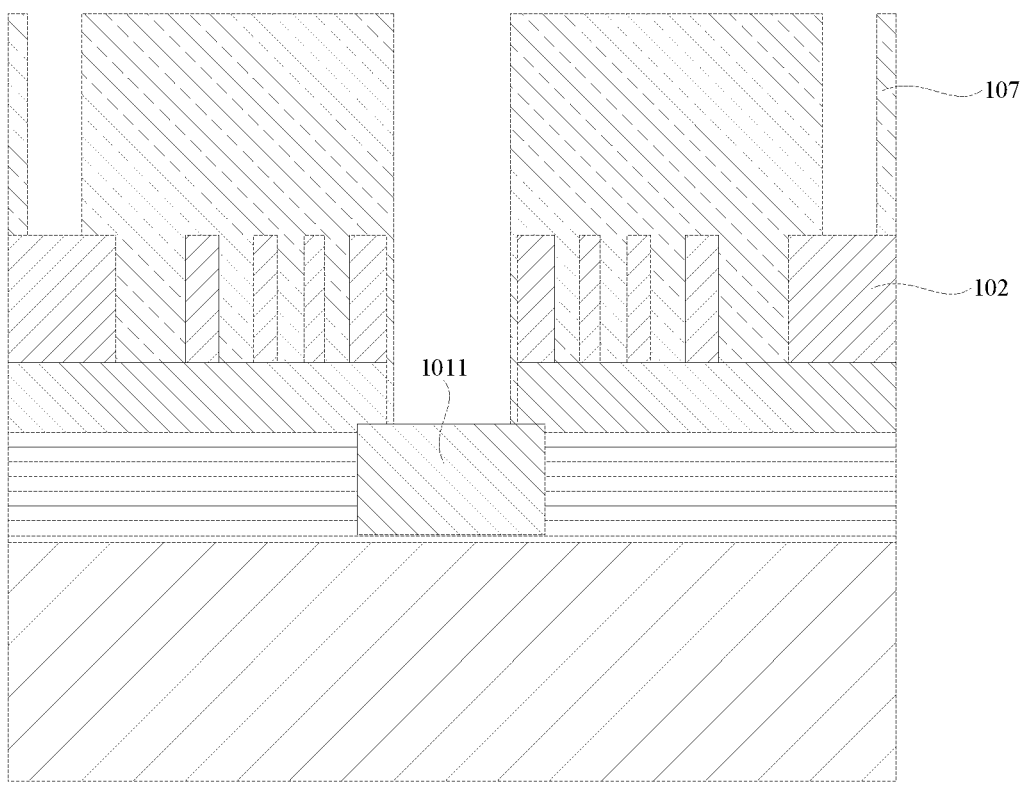
FIG. 8 is a schematic structural diagram of patterning a mask layer according to an embodiment of the present disclosure.

As illustrated in FIG. 8, according to the patterned mask layer 107, part of the mask layer 107 may be removed by wet etching or dry etching. The mask layer 107 corresponding to the recess 1071 is removed so as to expose the metal wiring layer 1011 in the recess 1071, and part of the mask layer on the intermediate insulating layer 102 is removed to expose part of the intermediate insulating layer, so as to form a conductive pillar 104 in each recess 1071 and on the exposed intermediate insulating layer 102, and the welding portion 1041 is formed on the end, far away from the chip, of each conductive pillar 104. Herein, the conductive pillar 104 in each recess 1071 and the welding portion 1041 on the conductive pillar 104 form the conductive pillar bump 104a, and the conductive pillar 104 on the intermediate insulating layer 102 and the welding portion 1041 on the conductive pillar 104 form the support bump 104b.

It is understandable that the conductive pillar 104 and the welding portion 1041 on the metal wiring layer 1011 and the conductive pillar 104 and the welding portion 1041 on the intermediate insulating layer 102 are formed by integrated molding, that is, the conductive pillar bump 104a and the support bump 104b are formed by an integrated molding process.

Figure 9:
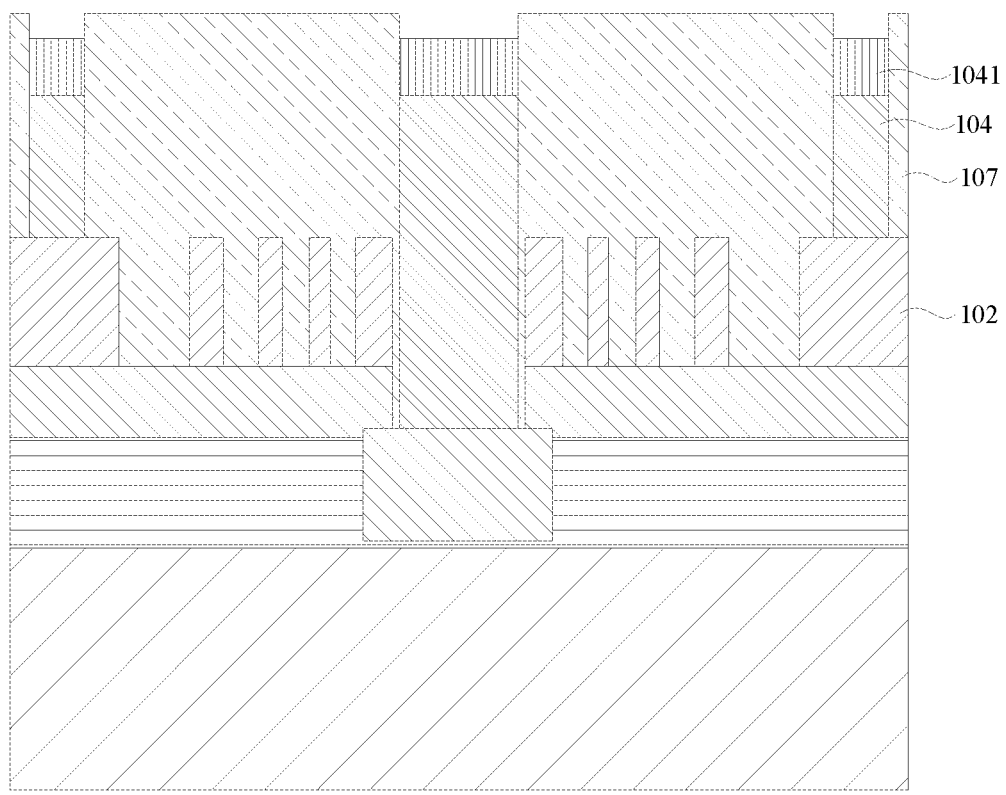
FIG. 9 is a schematic structural diagram of forming a conductive pillar bump according to an embodiment of the present disclosure.

As illustrated in FIG. 9, it is understandable that the welding portion 1041 may be formed at the end, far away from the chip 101, of the conductive pillar 104 by electroplating.

Figure 10:
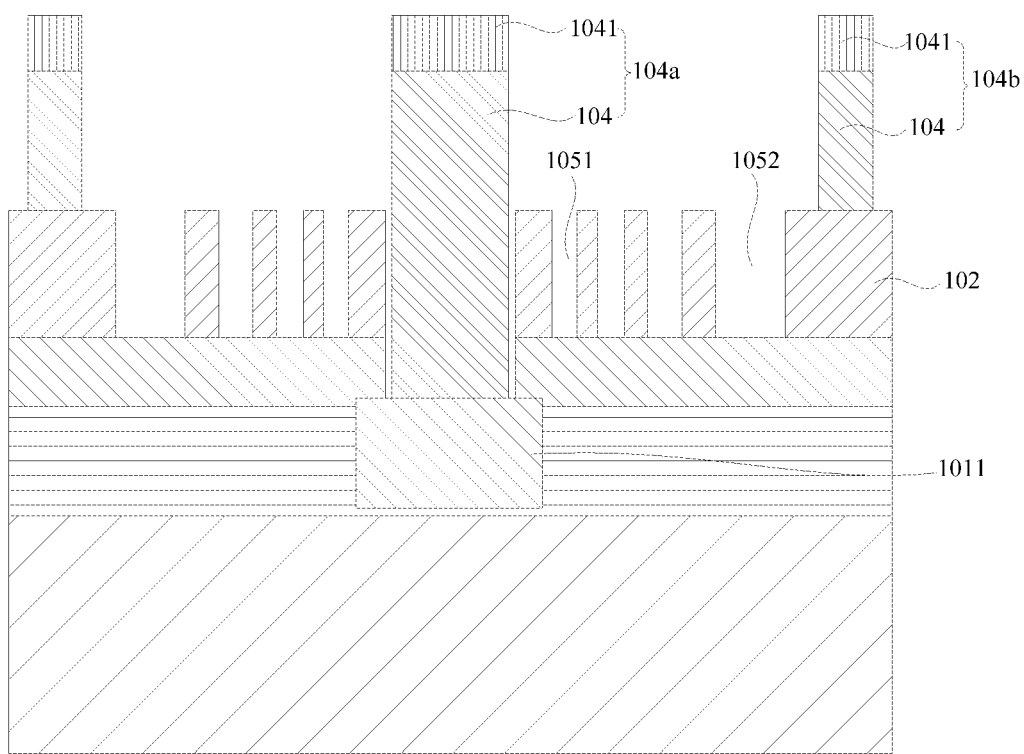
FIG. 10 is a schematic structural diagram of removing a mask layer according to an embodiment of the present disclosure.

As illustrated in FIG. 10, after the conductive pillar bump 104a is formed in each recess 1071 and the support bump 104b is formed, the mask layer 107 is removed.

Figure 11:
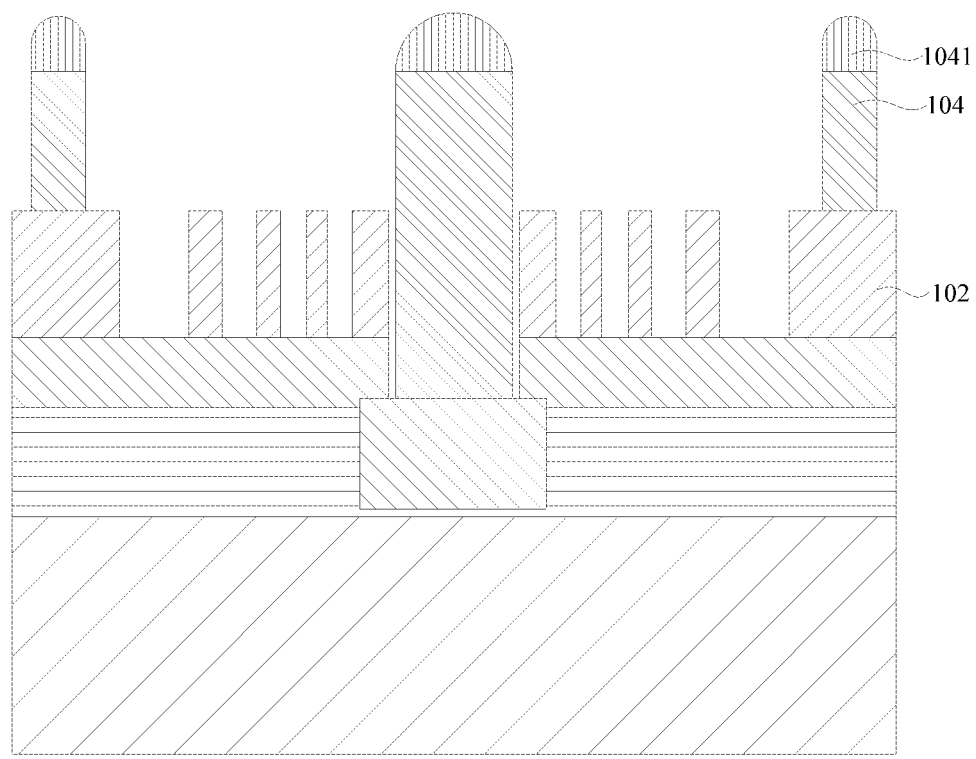
FIG. 11 is a schematic structural diagram of a conductive pillar bump after reflowing according to an embodiment of the present disclosure.

As illustrated in FIG. 11, at a second preset temperature, the welding portion 1041 reflows toward the side of the conductive pillar 104, so that the welding portion 1041 forms a curved surface bent to the side far away from the conductive pillar 104. Herein, the curved surface may be an arc-shaped surface, or an elliptical curved surface, etc.

At S105, a non-conductive adhesive layer is formed on the intermediate insulating layer, and the non-conductive adhesive layer fills the holding holes, so that grooves respectively matched with the holding holes are formed in the surface, far away from the intermediate insulating layer, of the non-conductive adhesive layer.

As illustrated in FIG. 2, the non-conductive adhesive layer 103 is formed on the intermediate insulating layer 102, and the non-conductive adhesive may first fill the holding holes 105, so that the groove 1031 matched with the holding hole 105 may be formed on the non-conductive adhesive layer 103 corresponding to each holding hole 105. In this way, when the chip packaging structure 100 is packaged with the substrate, the non-conductive adhesive between the conductive pillar bump 104a and the substrate 200 and near the same may be extruded to overflow around the conductive pillar bump 104a, and the overflowing non-conductive adhesive may fill the groove 1031 near the edge of the conductive pillar bump 104a, thereby preventing the non-conductive adhesive from overflowing the edge of the chip 101 and then improving the yield of the packaged chip 101.

Figure 14:
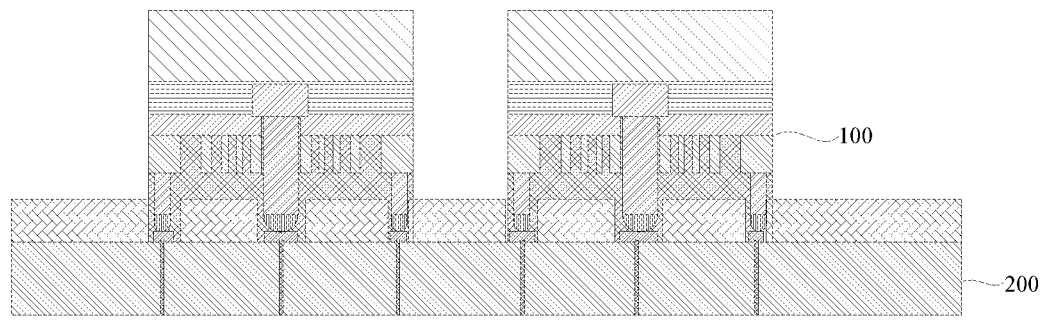
FIG. 14 is a schematic structural diagram of a chip packaging structure and a substrate after thermocompression bonding according to another embodiment of the present disclosure.

As illustrated in FIG. 14, the embodiments of the present disclosure provide a semiconductor structure, which includes: a substrate 200 and the chip packaging structure 100 provided in the above embodiments. Herein, the chip packaging structure 100 includes a plurality of conductive pillar bumps 104a arranged at intervals, a plurality of pads 201 corresponding to the plurality of conductive pillar bumps 104a being arranged on the substrate 200, and when the chip packaging structure 100 is located on the substrate 200 and packaged with the substrate 200, each conductive pillar bump 104a being welded and electrically conductive with the corresponding pad 201.

Figure 12:
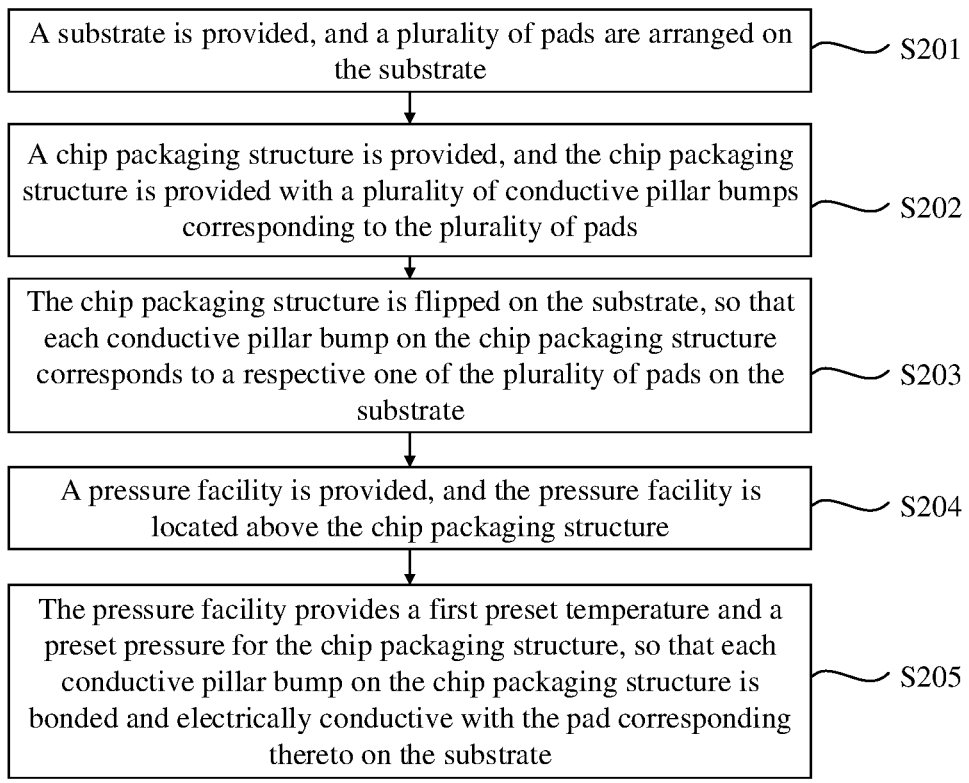
FIG. 12 is a flowchart of a method for packaging a semiconductor structure according to another embodiment of the present disclosure.

FIG. 12 is a flowchart of a method for packaging a semiconductor structure according to another embodiment of the present disclosure.

As illustrated in FIG. 12, the embodiments of the present disclosure also provide a method for packaging a semiconductor structure, which includes the following operations.

At S201, a substrate is provided, and a plurality of pads are arranged on the substrate.

Herein, the material of the pad includes one or a combination of copper, aluminum, nickel, gold, silver and titanium. The material of the substrate includes one or a combination of resins, silicon, glass, silicon oxide, ceramics and metal.

At S202, the chip packaging structure prepared by the method for preparing the chip packaging structure provided in the embodiments of the present disclosure is provided, and the chip packaging structure is provided with a plurality of conductive pillar bumps corresponding to the plurality of pads.

At S203, the chip packaging structure is flipped on the substrate, so that each of the plurality of conductive pillar bumps on the chip packaging structure corresponds to a respective one of the plurality of pads on the substrate (namely having a one-to-one correspondence).

At S204, a pressure facility is provided, and the pressure facility is located above the chip packaging structure.

At S205, the pressure facility provides a first preset temperature and a preset pressure for the chip packaging structure, so that each conductive pillar bump on the chip packaging structure is bonded and electrically conductive with the pad corresponding thereto on the substrate.

Figure 13:
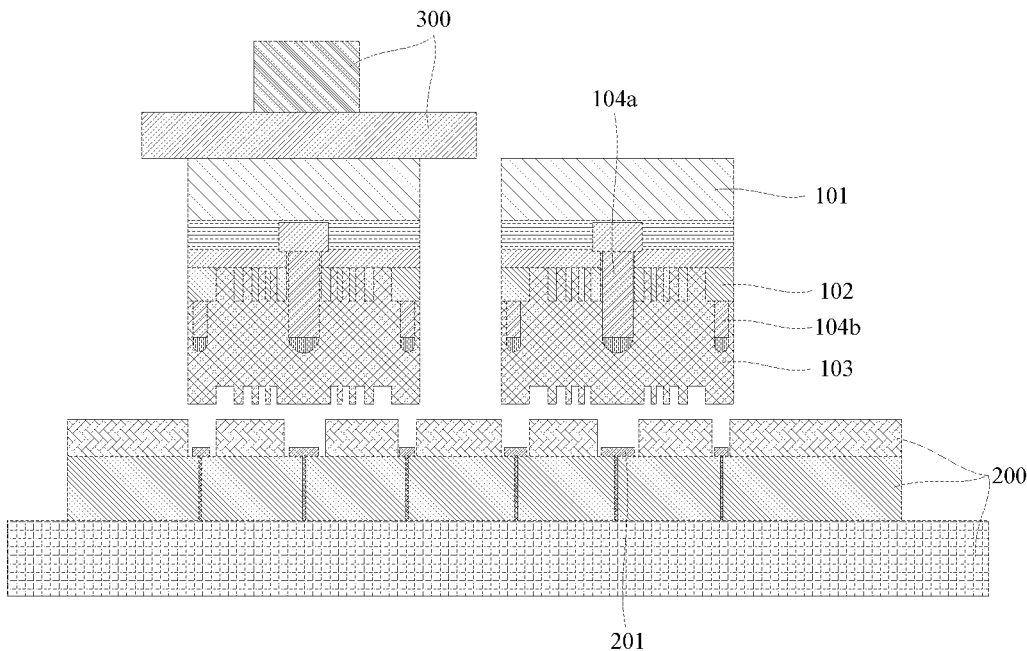
FIG. 13 is a schematic structural diagram of a chip packaging structure and a substrate in a thermocompression bonding process according to another embodiment of the present disclosure.

As illustrated in FIGS. 13 and 14, the pressure facility 300 also heats the chip packaging structure 100 and the substrate 200 while supplying pressure to the chip packaging structure 100 and the substrate 200, so that the pressure and temperature of thermocompression bonding are achieved between the chip packaging structure 100 and the substrate 200, and the conductive pillar bumps 104a on the chip packaging structure 100 are respectively welded and electrically conductive with the pads 201.

It is understandable that the heating temperature of a heating device on the chip 101 is 60° C.-70° C., so that the first preset temperature between the chip packaging structure 100 and the substrate 200 reaches 240° C.-250° C., the preset pressure is 5-12N, and the bonding time is 3-5 s.

Figure 15:
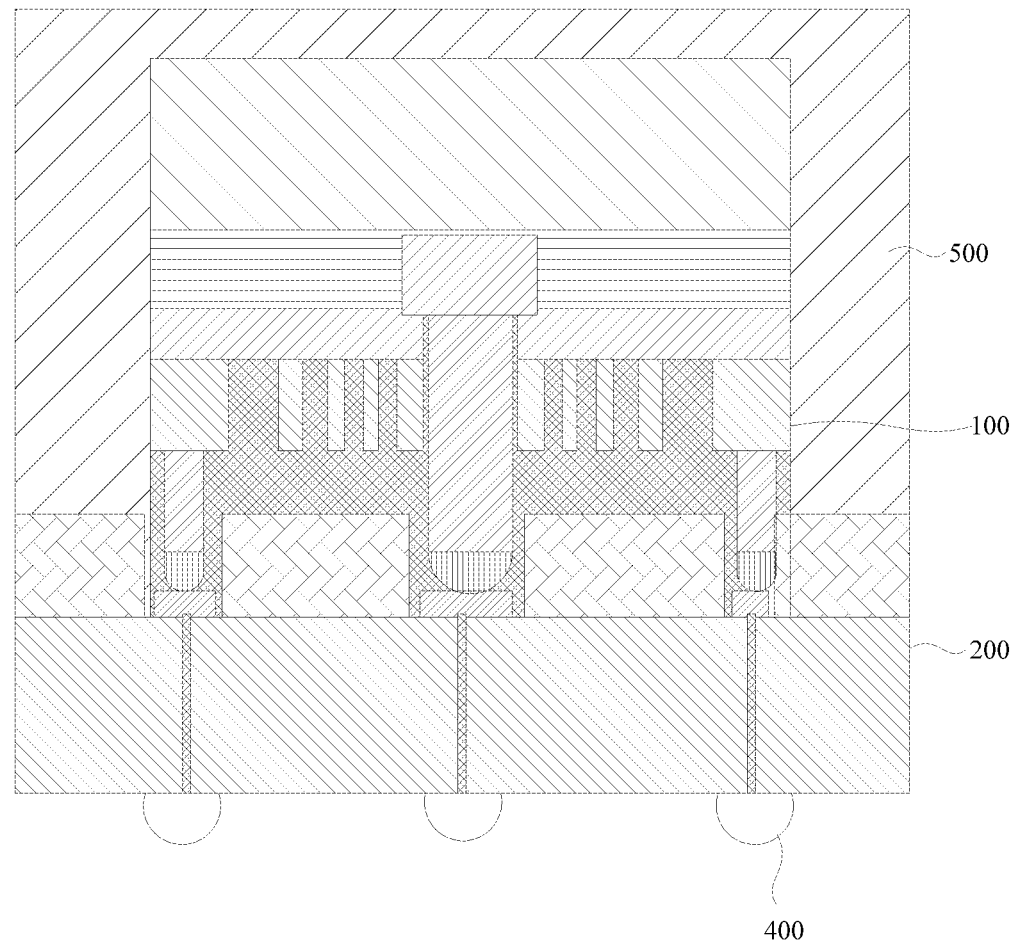
FIG. 15 is a schematic structural diagram of a packaged chip formed after the chip and a substrate are packaged according to another embodiment of the present disclosure.

As illustrated in FIG. 15, the pressure facility 300 provides the first preset temperature and the preset pressure for the chip packaging structure 100, so that after each conductive pillar bump 104a on the chip packaging structure 100 is bonded and electrically conductive with the pad 201 corresponding thereto on the substrate 200, the chip packaging structure 100 and the substrate 200 are baked; a plastic sealing layer 500 wrapping the substrate 200 and the chip packaging structure 100 is formed on the baked substrate 200 and the chip packaging structure 100; a solder ball 400 is formed on the surface, far away from the chip packaging structure 100, of the substrate 200 after plastic sealing; and the substrate 200 is cut, and the cut substrate 200, the corresponding solder ball 400 on the cut substrate 200 and the corresponding chip packaging structure 100 on the cut substrate 200 form a packaged chip.

The method for preparing the chip packaging structure, the semiconductor structure, and the method for packaging the semiconductor structure provided by the above embodiments have the same beneficial effects as those of the chip packaging structure, which will not be elaborated here.

The various embodiments or implementations in the present specification are described in a progressive manner, and each embodiment focuses on differences from other embodiments, and the same similar parts between the various embodiments can be referred to each other.

In the description of the present specification, descriptions of the reference terms "one implementation", "some implementations", "a schematic implementation", "an example", "a specific example", "some examples", or the like mean that specific features, structures, materials, or characteristics described in combination with the implementation or the example are included in at least one implementation or example of the present disclosure. In this specification, schematic representations of the above terms do not necessarily refer to the same implementation or example. Furthermore, the specific features, structures, materials, or characteristics described may be combined in any suitable manner in any one or more implementations or examples.

Finally, it is to be noted that the above embodiments are only intended to illustrate the technical solutions of the present disclosure, but not intended to limit the present disclosure. Although the present disclosure is described in detail with reference to the foregoing embodiments, it should be understood by those of ordinary skill in the art that: they may still make modifications to the technical solutions described in the foregoing embodiments or equivalent replacements to part or all of the technical features without any modification of the technical solutions or departures from the scope of the technical solutions of the embodiments of the present disclosure.

The invention claimed is:

1. A chip packaging structure, comprising:
a chip;
an intermediate insulating layer arranged on the chip; and
a non-conductive adhesive layer arranged on the intermediate insulating layer;
wherein the chip is arranged with a plurality of conductive pillar bumps, and each of the plurality of conductive pillar bumps penetrates through the intermediate insulating layer; and
wherein the intermediate insulating layer is provided with at least one group of holding holes, and the non-conductive adhesive layer fills the holding holes, so that grooves respectively matched with the holding holes are formed in a surface, far away from the intermediate insulating layer, of the non-conductive adhesive layer.

2. The chip packaging structure of claim 1, further comprising a plurality of support bumps,
wherein the plurality of support bumps form at least one support bump group, and the support bumps are respectively arranged on the intermediate insulating layer at intervals; and
wherein the plurality of conductive pillar bumps form at least one conductive pillar bump group, and a pattern formed by arranging the conductive pillar bumps in the conductive pillar bump group is different from a pattern formed by arranging the support bumps in the support bump group.

3. The chip packaging structure of claim 2, wherein the holding holes comprise a first holding hole and a second holding hole which communicate with each other, the first holding hole being arranged at one side of the conductive pillar bump group, and the second holding hole being arranged at one side of the support bump group.

4. The chip packaging structure of claim 3, wherein a pattern of the first holding hole is matched with the pattern formed by arranging the conductive pillar bumps in the conductive pillar bump group; and a pattern of the second holding hole is matched with the pattern formed by arranging the support bumps in the support bump group.

5. The chip packaging structure of claim 4, wherein at least two conductive pillar bump groups are provided, the at least two conductive pillar bump groups are arranged on the chip at intervals, and one conductive pillar bump group corresponds to one first holding hole.

6. The chip packaging structure of claim 4, wherein at least two support bump groups are provided, the at least two support bump groups are arranged on the intermediate insulating layer at intervals, and one support bump group corresponds to one second holding hole.

7. The chip packaging structure of claim 2, wherein the intermediate insulating layer is provided with an exhaust passage communicating with each group of holding holes, wherein one group of holding holes corresponds to one exhaust passage, and each exhaust passage extends to an edge of the intermediate insulating layer and communicates with the outside.

8. The chip packaging structure of claim 7, wherein a sum of projected areas of the holding holes on the intermediate insulating layer is 3.5-4 times a sum of projected areas of the plurality of conductive pillar bumps and the plurality of support bumps on the intermediate insulating layer.

9. The chip packaging structure of claim 1, wherein an end, far away from the chip, of the conductive pillar bump is provided with a welding portion, and the welding portion is a curved surface.

10. A method for preparing a chip packaging structure, comprising:
    providing a chip;
    forming an intermediate insulating layer on the chip;
    forming, on the intermediate insulating layer, at least one group of holding holes and a plurality of recesses exposing a metal wiring layer in the chip;
    forming a plurality of conductive pillar bumps in the plurality of recesses, wherein an end, far away from the chip, of each of the plurality of conductive pillar bumps, is provided with a respective welding portion, and the welding portion is a curved surface bent to a side far away from the conductive pillar bump; and
    forming a non-conductive adhesive layer on the intermediate insulating layer, and enabling the non-conductive adhesive layer to fill the holding holes, so that grooves respectively matched with the holding holes are formed in a surface, far away from the intermediate insulating layer, of the non-conductive adhesive layer.

11. The method of claim 10, wherein forming, on the intermediate insulating layer, the at least one group of holding holes and the plurality of recesses exposing the metal wiring layer in the chip comprises:
    patterning the intermediate insulating layer to form a first pattern group and a second pattern group on the intermediate insulating layer;
    removing the intermediate insulating layer according to the first pattern group to form at least one group of holding holes; and
    removing the intermediate insulating layer and part of the chip according to the second pattern group to expose the metal wiring layer in the chip so as to form the plurality of the recesses.

12. The method of claim 11, wherein, after removing the intermediate insulating layer according to the first pattern group to form the at least one group of holding holes; and removing the intermediate insulating layer and part of the chip according to the second pattern group to expose the metal wiring layer in the chip so as to form the plurality of the recesses, the method comprises:
    forming a respective conductive pillar in each recess, and forming conduction pillars on the intermediate insulating layer;
    forming a respective welding portion on each conductive pillar;
    forming, by the conductive pillar in each recess and a welding portion corresponding to the conductive pillar, the conductive pillar bump; and
    forming, by one of the conductive pillars on the intermediate insulating layer and a welding portion corresponding to the conductive pillar, a support bump.

13. The method of claim 12, wherein, after forming the respective welding portion on each conductive pillar, and forming, by the conductive pillar in each recess and the welding portion corresponding to the conductive pillar, the conductive pillar bump; and forming, by one of the conductive pillars on the intermediate insulating layer and the welding portion corresponding to the conductive pillar, the support bump, the method further comprises:
    reflowing the welding portion at a second preset temperature, so that the welding portion forms a curved surface bent to a side away from the conductive pillar.

14. A method for packaging a semiconductor structure, comprising:
    providing a substrate, wherein a plurality of pads are arranged on the substrate;
    providing a chip packaging structure, wherein the chip packaging structure is provided with a plurality of conductive pillar bumps corresponding to the plurality of pads;
    flipping the chip packaging structure on the substrate, so that each of the plurality of conductive pillar bumps on the chip packaging structure corresponds to a respective one of the plurality of pads on the substrate;
    providing a pressure facility, wherein the pressure facility is located above the chip packaging structure; and
    providing, by the pressure facility, a first preset temperature and a preset pressure for the chip packaging structure, so that each conductive pillar bump on the chip packaging structure is bonded and electrically conductive with the respective pad corresponding thereto on the substrate.

15. The method of claim 14, wherein, after providing, by the pressure facility, the first preset temperature and the preset pressure for the chip packaging structure, so that each conductive pillar bump on the chip packaging structure is bonded and electrically conductive with the respective pad corresponding thereto on the substrate, the method further comprises:
    baking the chip packaging structure and the substrate;
    forming a plastic sealing layer wrapping the substrate and the chip packaging structure on the baked substrate and the chip packaging structure;
    forming a solder ball on a surface, far away from the chip packaging structure, of the substrate after plastic sealing substrate; and
    cutting the substrate, and forming, by the cut substrate, the corresponding solder ball on the cut substrate and the corresponding chip packaging structure on the cut substrate, a packaged chip.

* * * * *